US012662752B2

(12) United States Patent
Chen et al.

(10) Patent No.: US 12,662,752 B2
(45) Date of Patent: Jun. 23, 2026

(54) VACANCY-RICH SILICON FOR USE WITH A GALLIUM NITRIDE EPITAXIAL LAYER

(71) Applicant: Taiwan Semiconductor Manufacturing Company, Ltd., Hsinchu (TW)

(72) Inventors: Pu-Fang Chen, Hsinchu City (TW); Ching Yu Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 261 days.

(21) Appl. No.: 18/191,129

(22) Filed: Mar. 28, 2023

(65) Prior Publication Data

US 2024/0141553 A1      May 2, 2024

Related U.S. Application Data

(60) Provisional application No. 63/381,157, filed on Oct. 27, 2022.

(51) Int. Cl.
*C30B 15/20* (2006.01)
*C30B 29/06* (2006.01)
(Continued)

(52) U.S. Cl.
CPC ............ *C30B 29/06* (2013.01); *C30B 15/203* (2013.01); *C30B 15/206* (2013.01); *C30B 33/02* (2013.01);
(Continued)

(58) Field of Classification Search
CPC ..... C30B 29/06; C30B 15/203; C30B 15/206; H01L 21/0254; H01L 21/02381; H01L 21/02598
See application file for complete search history.

(56) References Cited

U.S. PATENT DOCUMENTS 7,015,116 B1    3/2006    Lo et al.
8,962,400 B2    2/2015    Tsal et al.
(Continued)

FOREIGN PATENT DOCUMENTS

CN        113109363 B      9/2022
JP        2004533125 A  *  10/2004
(Continued)

OTHER PUBLICATIONS

Tan, Philp Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Robert M Kunemund
(74) *Attorney, Agent, or Firm* — Sterne, Kessler, Goldstein & Fox P.L.L.C.

(57) ABSTRACT

A manufacturing process is described to evaluate and select raw semiconductor wafers in preparation for epitaxial layer formation. The manufacturing process first produces a single crystal ingot during which a seed pulling velocity and temperature gradient are closely controlled. The resulting ingot is vacancy-rich with relatively few self-interstitial defects. Selected wafers can advance to a high-temperature nitridation annealing operation that further reduces the number of interstitials while increasing the vacancies. Substrates characterized by a high vacancy density can then be used to optimize an epitaxial layer deposition process.

20 Claims, 11 Drawing Sheets

200

202 — Form silicon crystal ingot

204 — Slice crystal ingot into silicon wafers

206 — Select vacancy-rich silicon wafers

208 — Anneal silicon wafers to improve thermal conductivity uniformity

210 — Deposit epitaxial gallium nitride layer

(51) Int. Cl.
  _C30B 33/02_ (2006.01)
  _H10P 14/20_ (2026.01)

(52) U.S. Cl.
  CPC ...... _H10P 14/2905_ (2026.01); _H10P 14/3416_
    (2026.01); _H10P 14/3458_ (2026.01)

(56) References Cited

U.S. PATENT DOCUMENTS

| | | | |
|---|---|---|---|
| 9,093,514 | B2 | 7/2015 | Tsal et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |

| | | | | |
|---|---|---|---|---|
| 2008/0311342 | A1 | 12/2008 | Muller et al. | |
| 2015/0243494 | A1* | 8/2015 | Hayden | C30B 23/025 |
| | | | | 117/106 |
| 2022/0291145 | A1 | 9/2022 | Wei et al. | |

FOREIGN PATENT DOCUMENTS

| | | | | |
|---|---|---|---|---|
| MY | 157902 | A * | 8/2016 | C30B 15/00 |
| TW | I376435 | B | 11/2012 | |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," CHIN.PHYS.LETT. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

\* cited by examiner

804

802

VACANCY-RICH SILICON FOR USE WITH A GALLIUM NITRIDE EPITAXIAL LAYER

CROSS-REFERENCE TO RELATED APPLICATIONS

This application claims the benefit of U.S. Provisional Application No. 63/381,157, filed on Oct. 27, 2022, titled "Vacancy-Rich Silicon for Use with a Gallium Nitride Epitaxial Layer," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors, including planar metal oxide semiconductor field effect transistors and fin field effect transistors. Such scaling down has increased the complexity of semiconductor manufacturing processes and has made the processes and the devices more sensitive to underlying materials.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
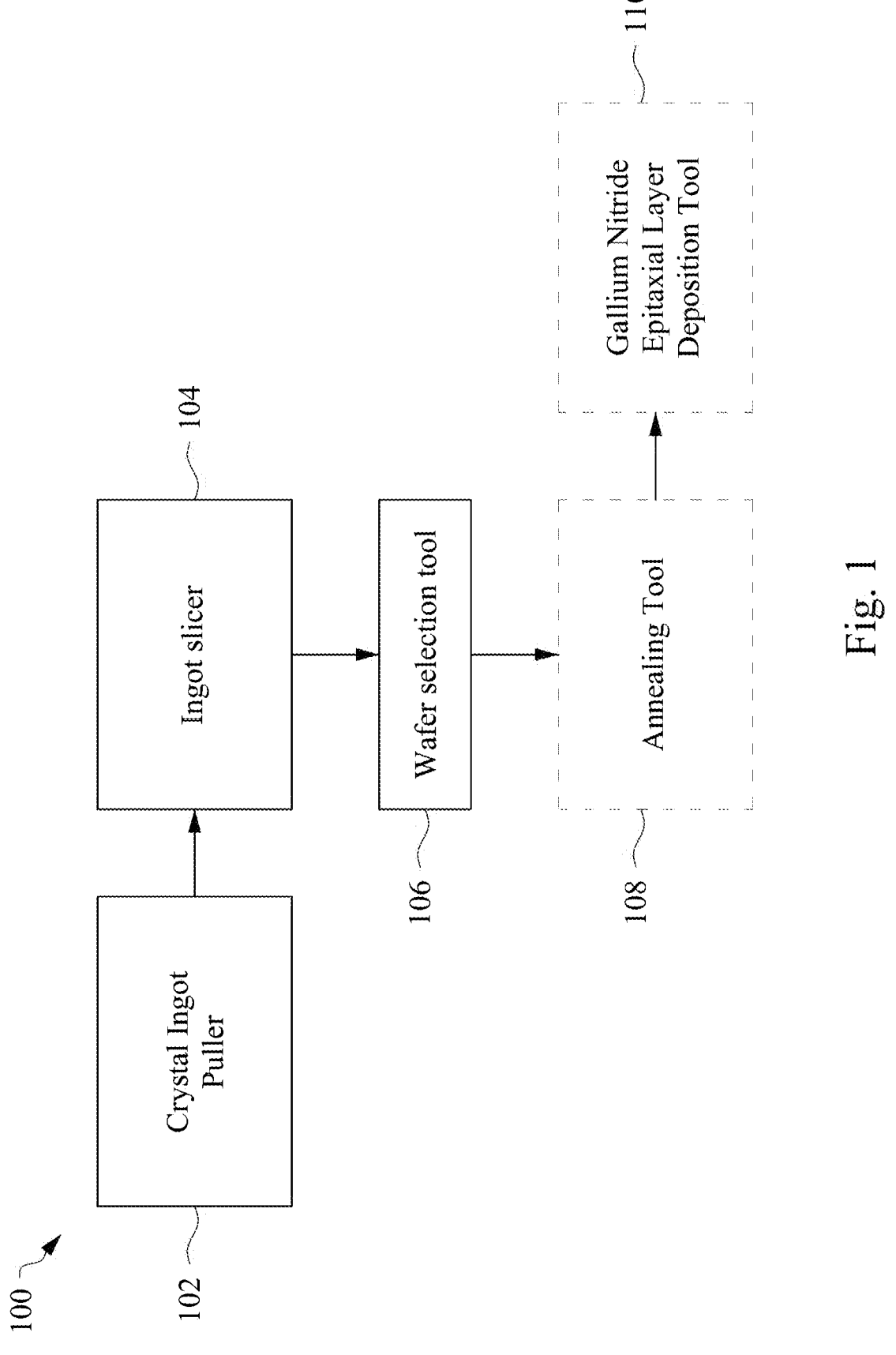
FIG. 1 is a block diagram of a manufacturing system to prepare a semiconductor substrate for an epitaxial layer deposition process, in accordance with some embodiments of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, the terms "about" and "substantially" can indicate a value of a given quantity that varies within 20% of the value (for example, ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The term "vertical," as used herein, means perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

An initial operation in a semiconductor chip fabrication process can include formation of an epitaxial layer on a bare silicon wafer, which serves as the raw material for the manufacturing process. In some instances, the epitaxial layer can be silicon or silicon dioxide; in other instances, the epitaxial layer can be made of gallium nitride. Due to an inherent lattice mismatch between gallium nitride and an underlying silicon substrate, both the silicon and the gallium nitride can experience high stress (for example, thermal stress) during a gallium nitride epitaxial layer deposition process. As a result of the high stress, the quality of the gallium nitride epitaxial layer can be degraded.

One way to reduce such degradation of epitaxial gallium nitride is to maintain a substantially uniform temperature across the silicon wafer during the gallium nitride epitaxial layer deposition process. Maintaining a substantially uniform temperature during epitaxial growth also prevents edge defects in the silicon wafer that can adversely affect downstream operations. The ability to maintain the substantially uniform temperature during wafer processing is predicated on a degree of uniformity of thermal conductivity of the silicon wafer. Therefore, evaluation of incoming silicon wafer quality can be important to achieve high quality gallium nitride epitaxial layers.

FIG. 1 is a block diagram outlining a manufacturing system 100 that prepares semiconductor wafers (for example, silicon wafers (also referred to herein as "silicon substrates")) for an epitaxial layer deposition process (for example, a gallium nitride epitaxial layer deposition process). The epitaxial layer deposition process can be accomplished, for example, by a metal-organic chemical vapor deposition process. Manufacturing system 100 includes blocks 102, 104, 106, 108, and 110. One or more blocks 102, 104, 106, 108, and 110 can be operated by a single entity or by multiple entities in the semiconductor manufacturing process (for example, one or more of a semiconductor wafer supplier and a semiconductor chip manufacturer), according to some embodiments of the present disclosure.

In some embodiments of the present disclosure, blocks 102 and 104 are operated by a semiconductor wafer supplier, indicated by the heavy outlines of blocks 102 and 104. Block 102 produces a crystal ingot, which is then sliced into silicon wafers at block 104. A crystal ingot is a pure solid form of a metal, created from a liquid by cooling under controlled conditions. After the crystal ingot is formed, the crystal ingot can be sliced into wafers for use in fabricating semiconductor devices (for example, microprocessors, controllers, computer memory, and the like).

Block 106 represents a set of selection equipment in which the silicon wafers are evaluated and a subset of the silicon wafers are chosen according to a set of quality criteria. In some embodiments of the present disclosure, block 106 can be operated by either the semiconductor wafer supplier or by a semiconductor chip manufacturer. The semiconductor chip manufacturer can purchase the silicon wafers as raw material for a semiconductor chip fabrication process. In some embodiments of the present disclosure, the set of quality criteria includes a high proportion of the silicon wafer containing vacancies and a low proportion of the silicon wafer containing interstitial defects that are linked to thermal conductivity degradation.

There are several methods by which the wafer selection tool 106 can check the quality of incoming wafers for vacancies and interstitial defects. A first method is to photograph the wafer and create from the photograph a photoluminescence (PL) intensity image to highlight the presence of vacancies and interstitial defects and a signature Oxidation Induced Stacking Fault ring. A second method of wafer selection is to test a sample wafer by performing a wet oxidation process to highlight the presence of an Oxidation Induced Stacking Fault ring and a region rich in interstitial defects. A third method of selecting high quality wafers is to perform a Secco etching process followed by a defect inspection operation, whereby the types of defects revealed by the Secco etching process indicate whether the wafer is vacancy-rich or interstitial-rich. These three methods are explained in greater detail below.

Any or all of the quality control methods executed by wafer selection tool 106 can be automated using an image analyzer that is a component of wafer selection tool 106. The image analyzer can be programmed to perform an automated inspection of the wafer and to recognize signatures of various defects and regions of the wafer following one or more enhancement processes. An automated evaluation of incoming wafers can increase throughput and provide an objective quality control system that operates with consistency.

Blocks 108 and 110 are operated by the semiconductor chip manufacturer, as indicated by the heavy dashed outlines of blocks 108 and 110, according to some embodiments of the present disclosure. Block 108 is a thermal annealing tool that can perform a multi-operation heat treatment In some embodiments of the present disclosure, the annealing operation exposes silicon wafers to high temperatures in a nitrogen gas environment to reduce interstitial defects within the crystal structure of the silicon wafer. Block 110 is a gallium nitride epitaxial layer deposition tool. In some embodiments of the present disclosure, the gallium nitride epitaxial layer deposition tool is used to provide a layer with high purity in which to form integrated circuits.

Manufacturing system 100, as described herein with respect to silicon wafers, applies equally to other types of semiconductor wafers that can be substituted for a silicon substrate and that depend on what types of semiconductor chips are being fabricated on the substrate. Such alternative substrate materials include, for example, germanium; compound semiconductors including silicon carbide, gallium arsenide, gallium phosphide, indium phosphide, indium arsenide, and/or indium antimonide; alloy semiconductors including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; and combinations thereof.

Although the techniques described herein are directed to forming an epitaxial gallium nitride layer on silicon, the same or similar techniques can be used to facilitate an epitaxial layer growth of other materials on any of the substrates listed above. Such materials can include, for example, oxides, nitrides, oxynitrides, carbides, and other compounds of silicon, gallium, and other semiconductors, and combinations thereof.

Figure 2:
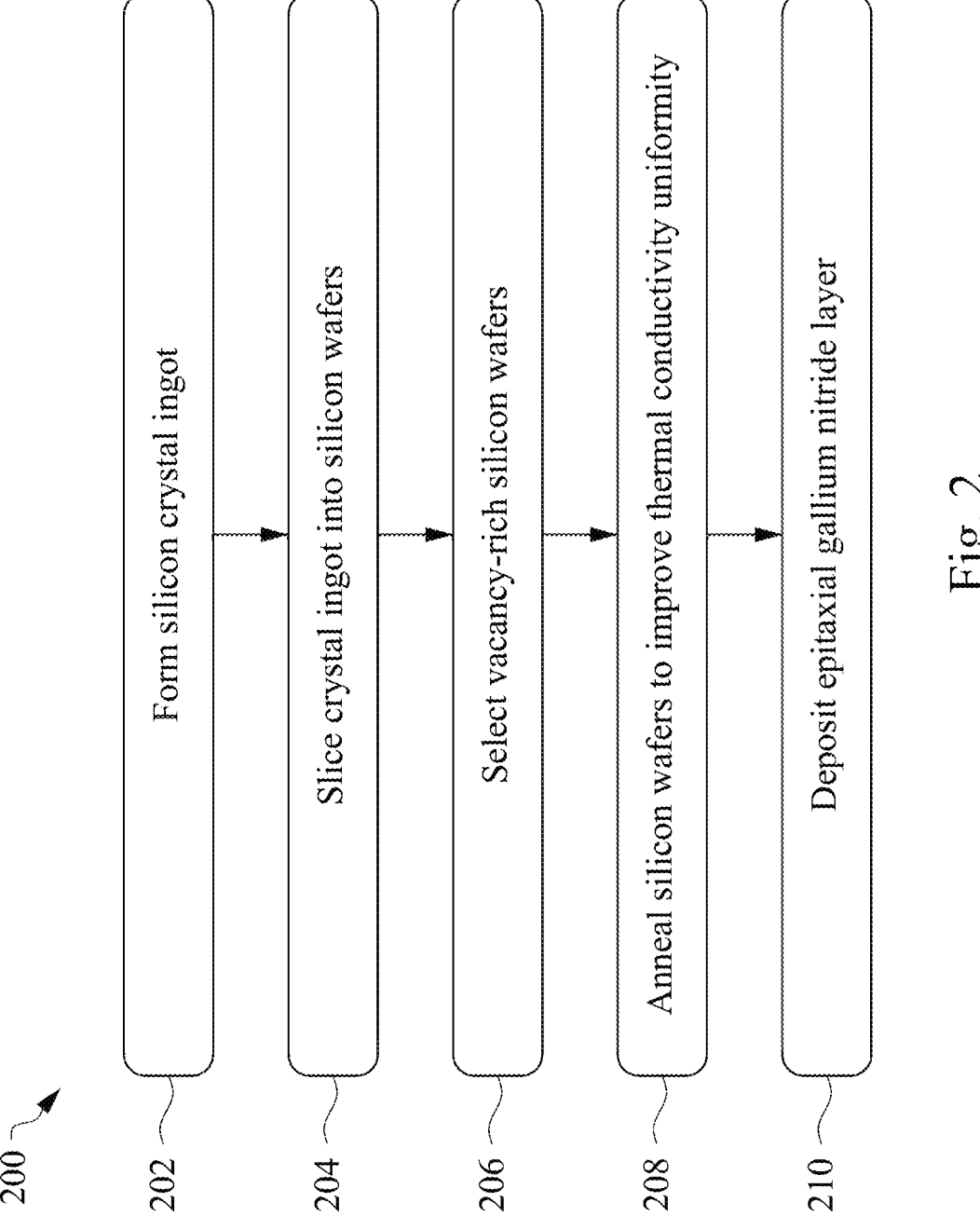
FIG. 2 is a flow diagram of a method for fabricating a silicon substrate suitable for a gallium nitride epitaxial layer deposition process, in accordance with some embodiments of the present disclosure.

FIG. 2 illustrates a method 200 for fabricating silicon substrates with a surface layer of epitaxial gallium nitride, following the manufacturing system 100 of FIG. 1, according to some embodiments of the present disclosure. For illustrative purposes, the operations illustrated in FIG. 2 will be described with reference to processes for fabricating silicon substrates as illustrated in FIGS. 3, 4, 5A, 5B, 6, 7, 8A, and 8B, 9, 10A, 10B, 11A, and 11B, which are views of silicon wafers at various stages of their fabrication, according to some embodiments of the present disclosure. The operations of method 200 can be performed in a different order, or not performed, depending on specific applications. It is noted that method 200 may not produce a complete silicon substrate that is suitable for a gallium nitride epitaxial layer deposition process. Accordingly, it is understood that additional processes can be provided before, during, or after method 200, and that some of these additional processes may be briefly described herein.

Figure 3:
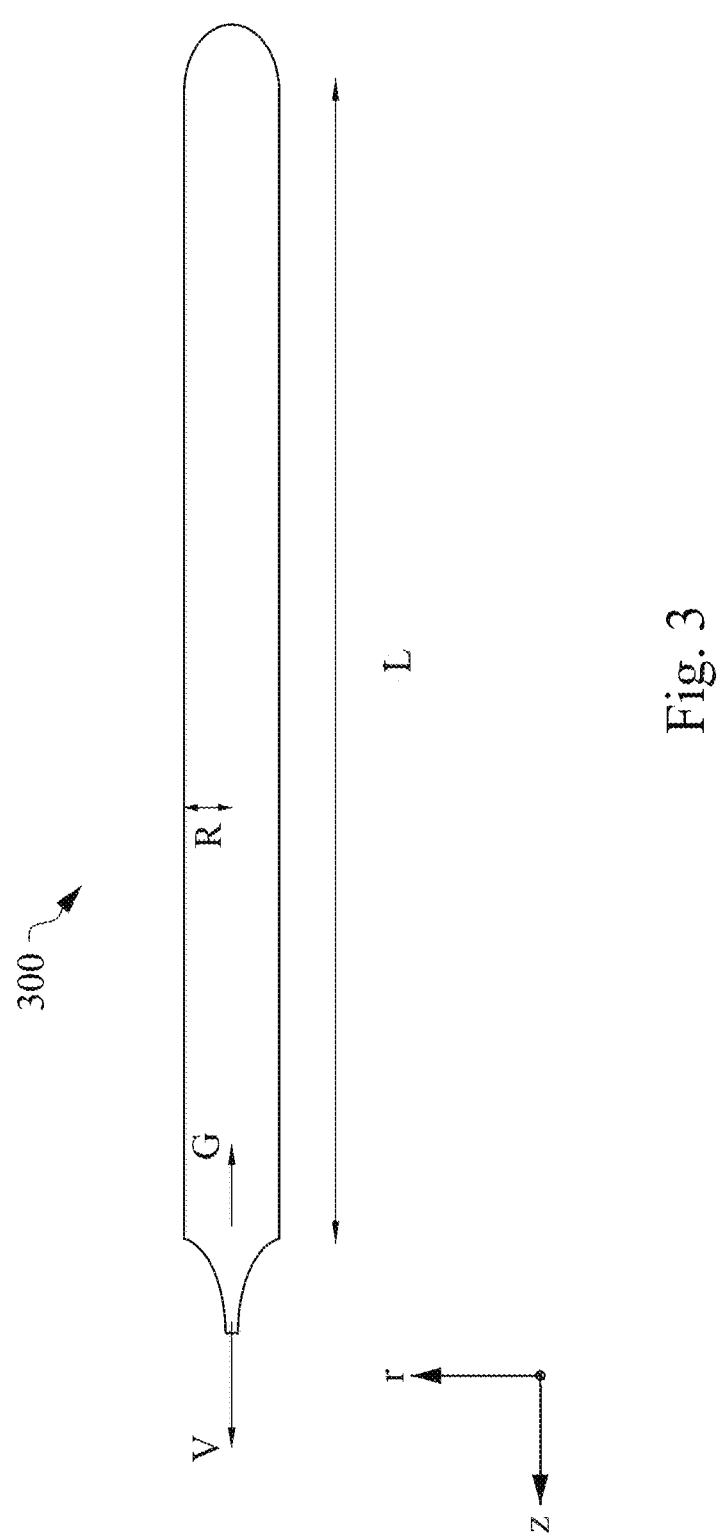
FIG. 3 is a pictorial view of a silicon ingot, in accordance with some embodiments of the present disclosure.

Referring to FIG. 2, in operation 202, a high purity silicon crystal ingot 300, from which silicon wafers are cut, can be formed. As shown in FIG. 3, silicon crystal ingot 300 is oriented horizontally, aligned with the z-axis. The silicon is initially in a molten form, or "melt," so that a silicon filament can be pulled along axial direction z from a seed crystal. While the seed crystal is pulled, it is simultaneously rotated, to initiate formation of an elongated cylindrical solid monocrystalline ingot, according to a method known as the "Czochralski method."

A radius R of the resulting cylindrical silicon crystal ingot 300 can be, for example, 150 mm, 200 mm, 300 mm, or 450 mm, depending on what type of devices will be fabricated on the silicon substrates and depending on the tooling of the semiconductor chip manufacturer's fabrication facility. A length L of the resulting cylindrical silicon crystal ingot 300 can be, for example, in the range of about 1 meter to about 2 meters. During the pulling process, an axial temperature gradient G exists along the z-axis of the silicon crystal ingot 300 close to the crystal-melt interface. The crystal-melt interface is a location where the temperature of the filament is cool enough for the silicon atoms to begin self-organizing into the form of a monocrystalline solid. The rate at which the crystal is pulled is given by a pulling velocity V. A ratio of the pulling velocity to the axial temperature gradient ("ratio V/G") can be adjusted to influence the types, number, density, and distribution of crystal defects that are likely to form in silicon crystal ingot 300 as it is pulled from the melt. Values of the ratio V/G can be in a range of about 0.00155 $cm^2$/min ° K to about 0.0020 $cm^2$/min ° K, according to some embodiments of the present disclosure.

Figure 4:
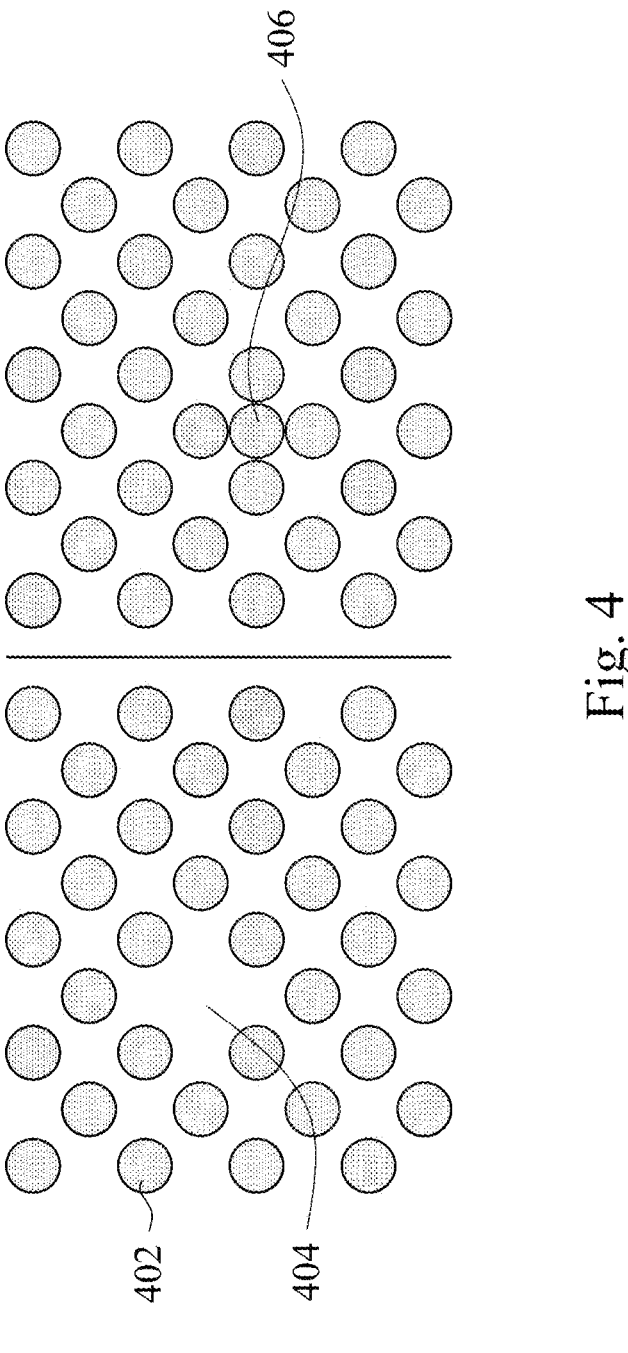
FIG. 4 is a pictorial magnified view of atomic arrangements in a silicon lattice, in accordance with some embodiments of the present disclosure.

FIG. 4 shows types of localized, point defects in a crystal lattice 400 made up of a regular array of silicon atoms 402 arranged in substantially parallel crystal planes. Wherever microscopic point defects are present in a crystal lattice, they can affect macroscopic properties of the bulk silicon, such as thermal conductivity of the substrate. When the wafer is later subjected to high temperature processes (for example, at or above 900 degrees Celsius), the thermal conductivity of the substrate can affect whether the high temperature process is effective. With reference to the left side of FIG. 4, a vacancy 404 is formed when a silicon atom 402 is missing from crystal lattice 400. A substitutional defect is formed when a different silicon atom is substituted for one of the silicon atoms 402 by filling vacancy 404 in crystal lattice 400. With reference to the right side of FIG. 4, a self-interstitial 406 is formed when an extra silicon atom 402 is inserted into a space between two adjacent planes of crystal lattice 400. Such defects involving silicon atoms are intrinsic defects. A foreign interstitial is formed when a different, non-silicon atom (for example, a germanium atom) occupies a space between two adjacent planes of crystal lattice 400. Such defects involving non-silicon atoms are extrinsic defects. Thus, at least four types of crystal defects can occur in crystal lattice 400: vacancies, substitutional, self-interstitial, and foreign interstitial.

Figures 5A, 5B:
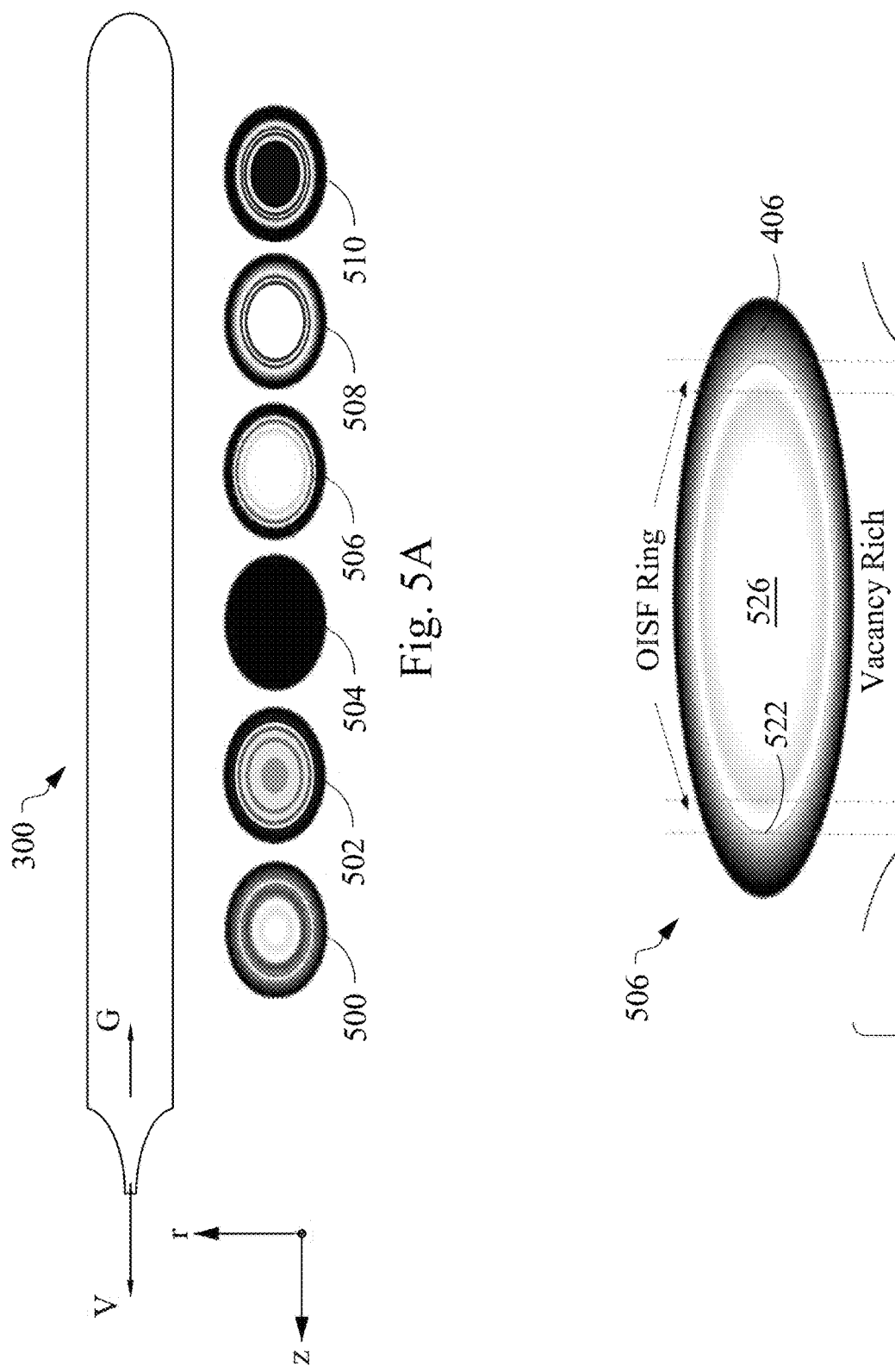
FIG. 5A is a pictorial view of wafers cut from various portions of the silicon ingot shown in FIG. 3, in accordance with some embodiments of the present disclosure.
FIG. 5B is a magnified view of one of the wafers cut from the silicon ingot shown in FIG. 3, in accordance with some embodiments of the present disclosure.

Referring to FIG. 2, in operation 204, silicon crystal ingot 300 is sliced into silicon wafers 500-510, as shown in FIG. 5A. Silicon wafers 500, 502, 504, 506, 508, and 510 represent variations in defect types and cross-wafer distributions found at different axial distances along the z-axis of silicon crystal ingot 300. White areas within silicon wafers 500, 502, 504, 506, 508, and 510 indicate vacancy-rich crystal regions, while black areas within silicon wafers 500, 502, 504, 506, 508, and 510 indicate regions where a high density of self-interstitial defects 406 accumulate. Gray areas within silicon wafers 500, 502, 504, 506, 508, and 510 indicate regions where a lower density of self-interstitial defects 406 can be found.

By correlating these various defect distributions within silicon wafers 500, 502, 504, 506, 508, and 510 with edge defects measured in-line during the semiconductor chip manufacturing process, in-line edge defects resulting in low semiconductor chip yields correlate with silicon wafers that were cut from regions of silicon crystal ingot 300 that have a high density of self-interstitial defects 406. Furthermore, a relationship exists between thermal conductivity (for example, measured in Watts per meter-degrees Kelvin) and a concentration of interstitial defects within a silicon crystal lattice. The presence of interstitial atoms such as carbon, silicon, germanium, and lithium in silicon crystal ingot 300 can reduce the thermal conductivity of the silicon wafer by a factor of about 30 to about 34. That is, the thermal conductivity of silicon can be about 30 to about 34 times smaller when interstitial defects are present. A presence of as few as about 0.5% self-interstitials in silicon crystal ingot 300 can degrade thermal conductivity by as much as about 60%. This degradation can be the result of interstitial defects 406 (of FIG. 4) scattering heat-carrying phonons to suppress thermal transport. Furthermore, because edge defects correspond to an end-of-line failure mode associated with a gallium nitride-to-substrate leakage current, low thermal conductivity of silicon wafers may be a cause of the gallium nitride-to-substrate leakage current.

Referring to FIG. 2, in operation 206, selected silicon wafers are chosen from among silicon wafers 500, 502, 504, 506, 508, and 510 cut from silicon crystal ingot 300.

In some embodiments of the present disclosure, quality control criteria for evaluating silicon wafers (for example, from a semiconductor wafer supplier) can include, for example, thermal conductivity, a (111) crystal orientation, vacancy density, oxygen concentration between 12 and 15 parts per million atomic (ppma); a carbon concentration less than about 1.0 ppma; metal contamination less than about $5\times10^{10}$ atoms/$cm^2$, resistivity in a range of about 8 Ω-cm to about 12 Ω-cm, a diameter between about 149.5 mm and about 150.5 mm; a thickness between about 980 μm and about 1020 μm; a bow less than about 30 μm; a rounded edge profile; zero scratches; and less than 150 particles of diameter 0.12 μm or greater.

Figure 6:
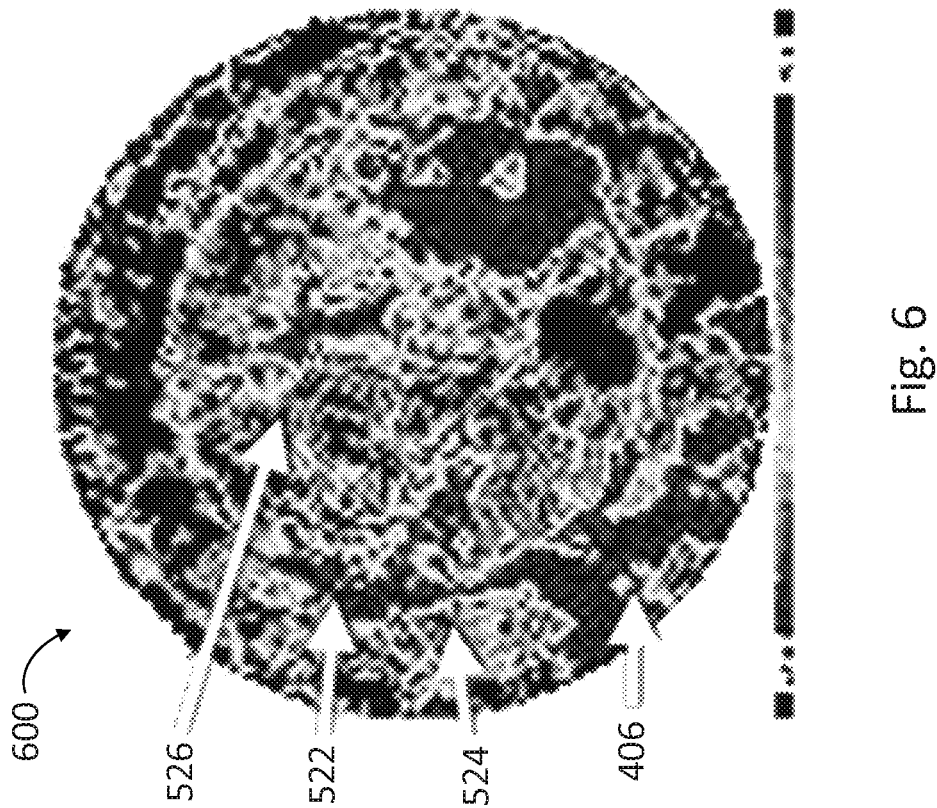
FIG. 6 is a photo luminescent wafer map, in accordance with some embodiments of the present disclosure.

In some embodiments of the present disclosure, the selected silicon wafers have characteristics similar to vacancy-rich silicon wafers 506, as shown in FIG. 5A and enlarged in FIG. 5B. Each of silicon wafers 500, 502, 504, 506, 508, and 510 has a different edge distribution of self-interstitials 406. The edge distribution of self-interstitials 406 is indicated by a series of Oxidation Induced Stacking Fault rings 512, which signify boundaries of defect density variations, as shown in FIG. 5A, FIG. 5B, and FIG. 6.

In some embodiments of the present disclosure, the most desirable silicon wafers from among the different distributions represented by silicon wafers 500, 502, 504, 506, 508, and 510 are those with the largest vacancy-rich area, which are vacancy-rich wafers 506, at an axial position z in silicon crystal ingot 300, near the center of silicon crystal ingot 300 as shown in FIG. 5A. Vacancy-rich silicon wafers 506 are associated with a high thermal conductivity that is not expected to induce gallium nitride-to-substrate leakage later in the semiconductor manufacturing process. In some embodiments of the present disclosure, the next most desirable silicon wafers are those with the next largest vacancy-rich area, corresponding to silicon wafers 508, and so on. In some embodiments of the present disclosure, the least desirable silicon wafers are those saturated with self-interstitials 406, having no vacancies, and corresponding to silicon wafers 504 at an axial position z in silicon crystal ingot 300, to the left of center. Silicon wafers 504, having a high interstitial density, are associated with low thermal conductivity and are expected to induce the most gallium nitride-to-substrate leakage current later in the semiconductor manufacturing process.

The bottom of FIG. 5B shows a plot 520 of cross-wafer defect density of silicon wafer 506, with a high defect density of self-interstitials 406 at the silicon wafer's edges, coinciding with the darkest part of Oxidation Induced Stacking Fault ring 522 along the circumference of silicon wafer 506. A low defect density exists in transition zones 524 between Oxidation Induced Stacking Fault ring 522 and a vacancy-rich core 526. A high defect density of vacancies 404 is present in vacancy-rich core 526, as indicated by the elevated dotted line in the center of plot 520.

There are several methods for checking the quality of incoming wafers for vacancies and interstitial defects. In some embodiments, a photograph can be made of the wafer. Then, a photoluminescence (PL) intensity image can be created from the photograph to highlight certain features, FIG. 6 shows a photoluminescence (PL) intensity image 600 that indicates the presence of various features shown in FIGS. 5A and 5B, such as the vacancy-rich core 526, the Oxidation Induced Stacking Fault ring 522, a defect-free ring corresponding to transition zone 524, and an outer ring of self-interstitials 406. Of these, the two most prominent features are Oxidation Induced Stacking Fault ring 522 and the outer ring of self-interstitials 406. Enhanced features can then be recognized by an automated analysis of PL intensity image 600. In some embodiments, the automated analysis can incorporate machine learning to improve accuracy and speed of feature recognition.

Figure 7:
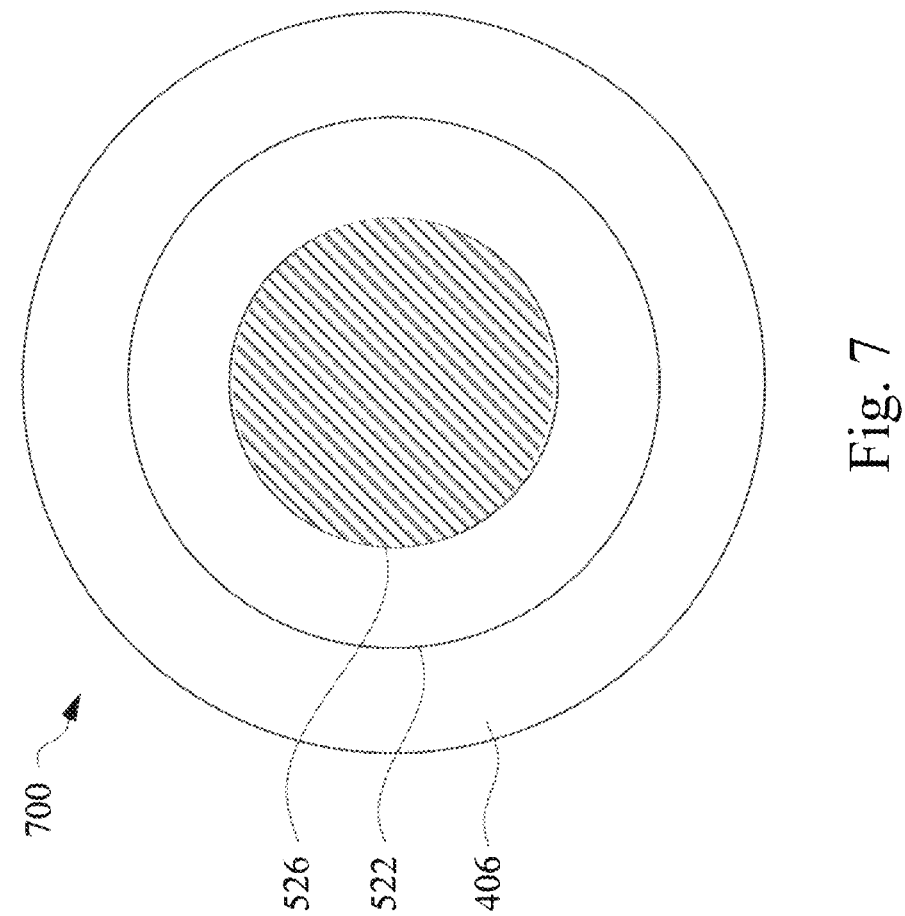
FIG. 7 is a photograph of a wet-oxidized wafer, in accordance with some embodiments of the present disclosure.

Referring to FIG. 7, in some embodiments, a wafer can be treated with a wet oxidation process at about 1100° C. for about 1 hour, followed by inspection using an optical microscope. In some embodiments, the inspection operation can be automated so that patterns can be recognized consistently by a programmable image analyzer. The wet oxidation process will highlight both the Oxidation Induced Stacking Fault ring 522 and an outer ring of self-interstitials 406, if they are present, as shown in FIG. 7. These features are clearly indicated and will become even more obvious with magnification. In some embodiments, if either or both features are present following the wet oxidation process, the wafer can be rejected.

Figure 8B:
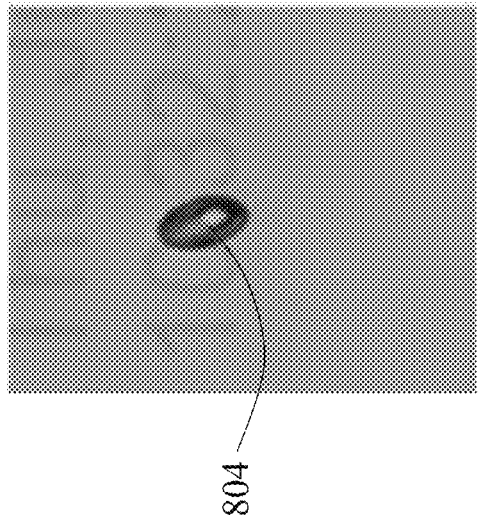
FIGS. 8A and 8B are micrographs of defects under an optical microscope, in accordance with some embodiments of the present disclosure.
Figure 8A:
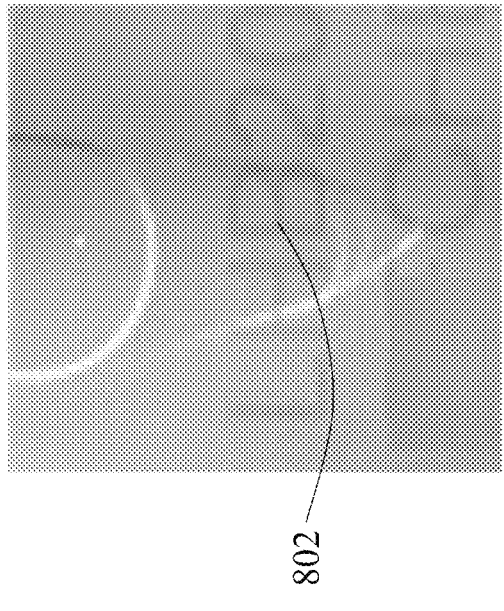

Referring to FIGS. 8A and 8B, in some embodiments, the wafer can be processed using a Secco etch, which is a mixture of about 1.3% $K_2Cr_2O_7$, about 34% hydrogen fluoride (HF), and about 64.7% water, followed by optical inspection at about 100× magnification. In this inspection, a determination can be made regarding the type of defects observed under the microscope. When the observed defects are flow pattern defects (FPDs) that indicate a cross-wafer flow pattern 802 as shown in FIG. 8A, it can be concluded that the wafer is vacancy-rich. When the observed defects are large dislocation pits (LDPs) aggregated into dislocation loops 804 as shown in FIG. 8B, it can be concluded that the wafer is self-interstitial rich, and the wafer can be rejected.

Figure 9:
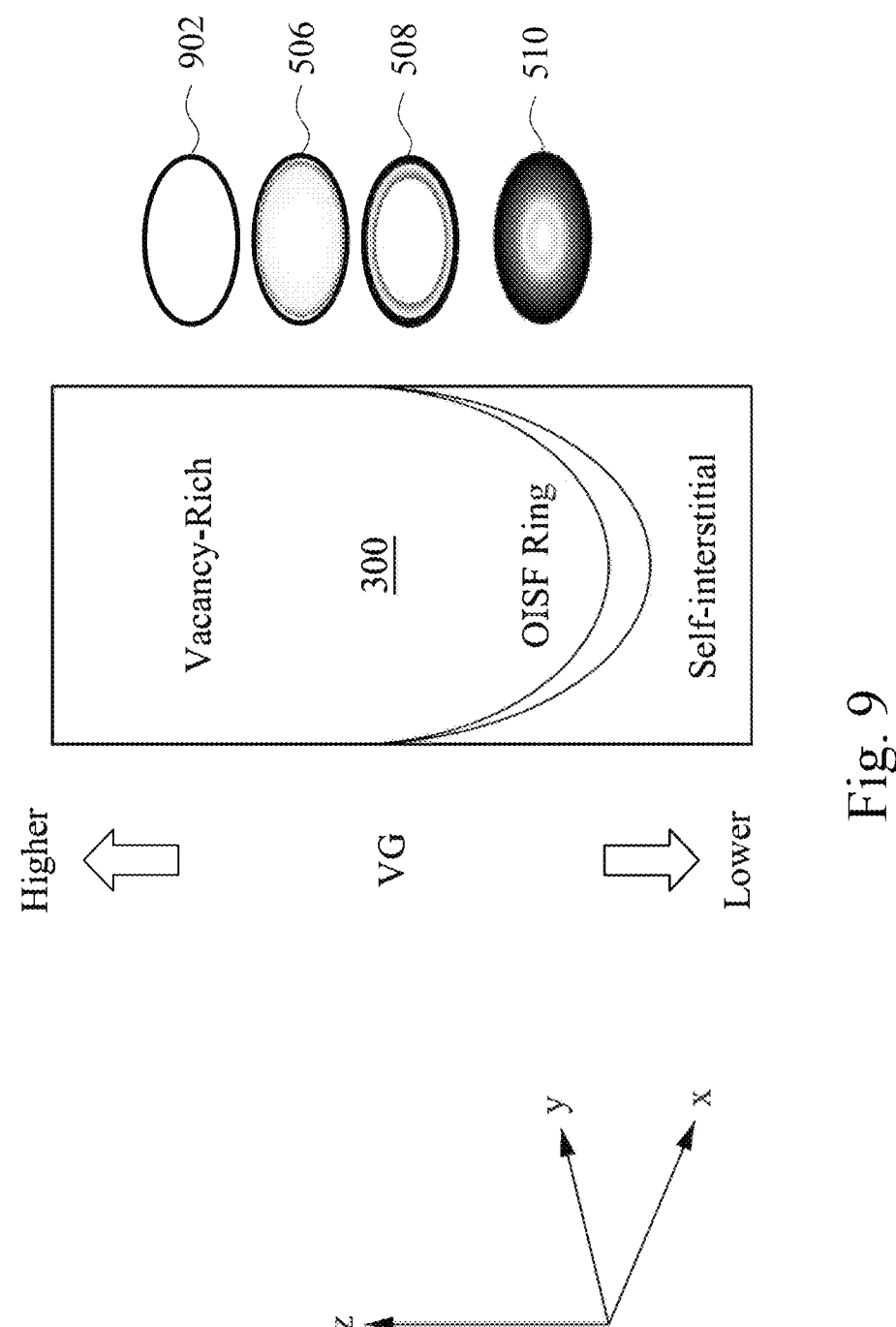
FIG. 9 is a plot of the relationship between V/G and the density of native defects within a silicon crystal ingot, in accordance with some embodiments of the present disclosure.

FIG. 9 shows a relationship 900 between the ratio V/G and the density of native defects within silicon crystal ingot 300. In FIG. 9, silicon crystal ingot 300 is rotated so that the z-axis is vertical. In some embodiments of the present disclosure, a larger number of vacancies 404 per silicon wafer and/or a larger number of vacancy-rich silicon wafers 506 can be produced by increasing the ratio V/G during the ingot pulling process, as indicated in the top portion of FIG. 9. For the highest values of ratio V/G, vacancies 404 can extend throughout the whole silicon wafer as shown in silicon wafer 902. For lower values of ratio V/G, vacancy-rich areas of silicon wafers 506, 508, and 510, for example, can be enlarged so that Oxidation Induced Stacking Fault rings only appear at the outer edges of the silicon wafers. In FIG. 9, the only remaining example silicon wafer that still has a significant number of self-interstitial defects 406 is silicon wafer 510. Accordingly, at operation 206, when the ratio V/G is increased, vacancy-rich substrates including silicon wafers 506 and 902 from the upper half of silicon crystal ingot 300, can be selected for compatibility with a subsequent gallium nitride epitaxial layer deposition process. Thus, operation 206 includes a determination of which silicon wafers have the most extensive vacancy-rich areas, so that those silicon wafers can be selected as the start material for a subsequent semiconductor fabrication process.

Figure 10B:
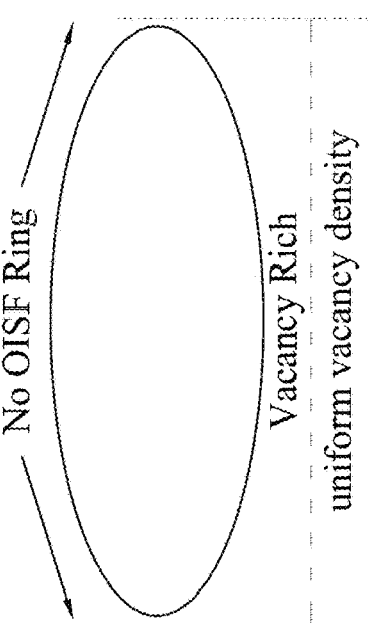
FIGS. 10A and 10B are wafer maps showing areas of vacancies and self-interstitials, in accordance with some embodiments of the present disclosure.
Figure 10A:
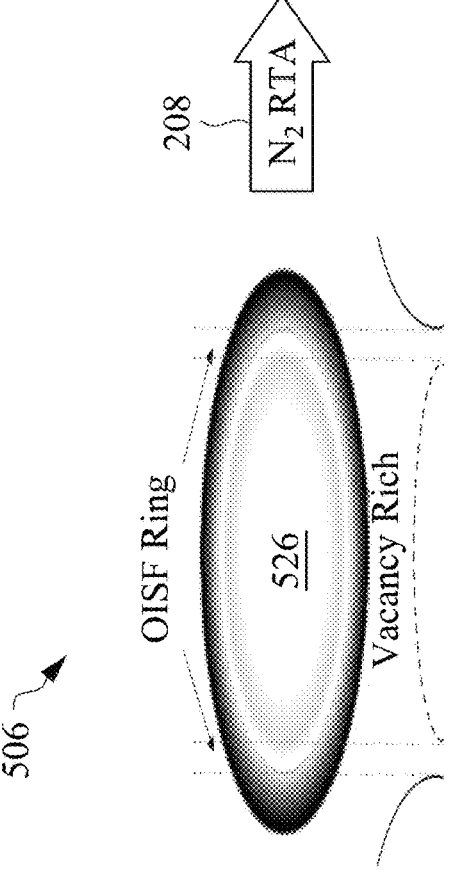

Referring to FIG. 2, in operation 208, an annealing process can be performed to improve uniformity of cross-wafer distribution of vacancies, as shown in before-and-after silicon wafer maps of FIGS. 10A and 10B. FIG. 10A reproduces FIG. 10B following selection of vacancy-rich silicon wafers from silicon crystal ingot 300, when each of the chosen silicon wafers initially has an Oxidation Induced Stacking Fault ring at the edge of the silicon wafer surrounding vacancy-rich core 526. In some embodiments of the present disclosure, operation 208 can be a high temperature nitrogen gas ($N_2$) rapid thermal anneal process in which $N_2$ is mixed with oxygen gas ($O_2$) such that $N_2$ is between about 90% and about 100% of the gas mixture. The nitrogen gas rapid thermal anneal process can have a high temperature phase followed by a nitridation phase, according to some embodiments of the present disclosure. Following operation 208, the same silicon wafer has a uniform vacancy density that is vacancy rich, and, as shown by the wafer maps of the defects, the Oxidation Induced Stacking Fault ring is substantially gone, because the anneal process has cleared self-interstitials 406 at the edges of the silicon wafer. It is noted that, according to the "after" silicon wafer map shown in FIG. 10B, the dotted line graph of vacancies is substantially flat, illustrating a high radial uniformity of vacancies 404.

In some embodiments of the present disclosure, the high-temperature phase of the nitrogen gas rapid thermal anneal process can expose the silicon wafers to temperatures greater than about 1200 degrees Celsius, for example, about 1200° C. to about 1280° C. During the high temperature phase of the nitrogen gas rapid thermal anneal process, the silicon wafer temperature can be increased rapidly so as to form high concentrations of vacancy-interstitial pairs in a short period of time. In some embodiments of the present disclosure, the anneal time can be in a range of about 60 seconds to about 200 seconds at a pressure between about 0.9 atmosphere and about 1.1 atmosphere. While the silicon wafer is at the high temperature, the vacancy and interstitial concentration profiles revert to equilibrium concentrations as self-interstitials 406 diffuse to the silicon wafer surface. The diffusion rate of self-interstitials 406 is greater than the fill rate of vacancies 404, thus leaving behind more vacancies 404 in the crystalline silicon wafer. Following the high-temperature phase of the nitrogen gas rapid thermal anneal process, silicon wafers can cool down at a cooling rate in a range of about 40° C./second to about 70° C./second.

During the subsequent nitridation phase of operation 208, the silicon wafers can be exposed to nitrogen gas, so that a nitridation reaction consumes self-interstitials 406 at the silicon wafer surface to further reduce self-interstitial concentrations.

Figure 11B:
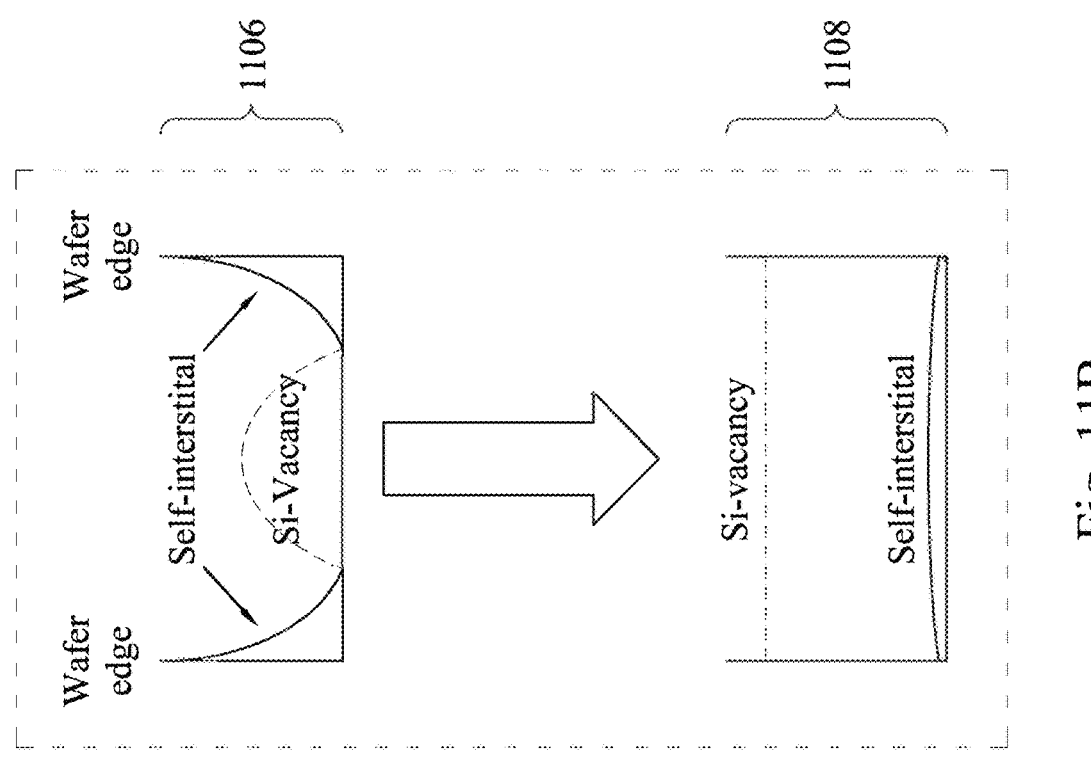
FIGS. 11A and 11B are cross-wafer plots of concentration profiles for vacancies and self-interstitials, in accordance with some embodiments of the present disclosure.
Figure 11A:
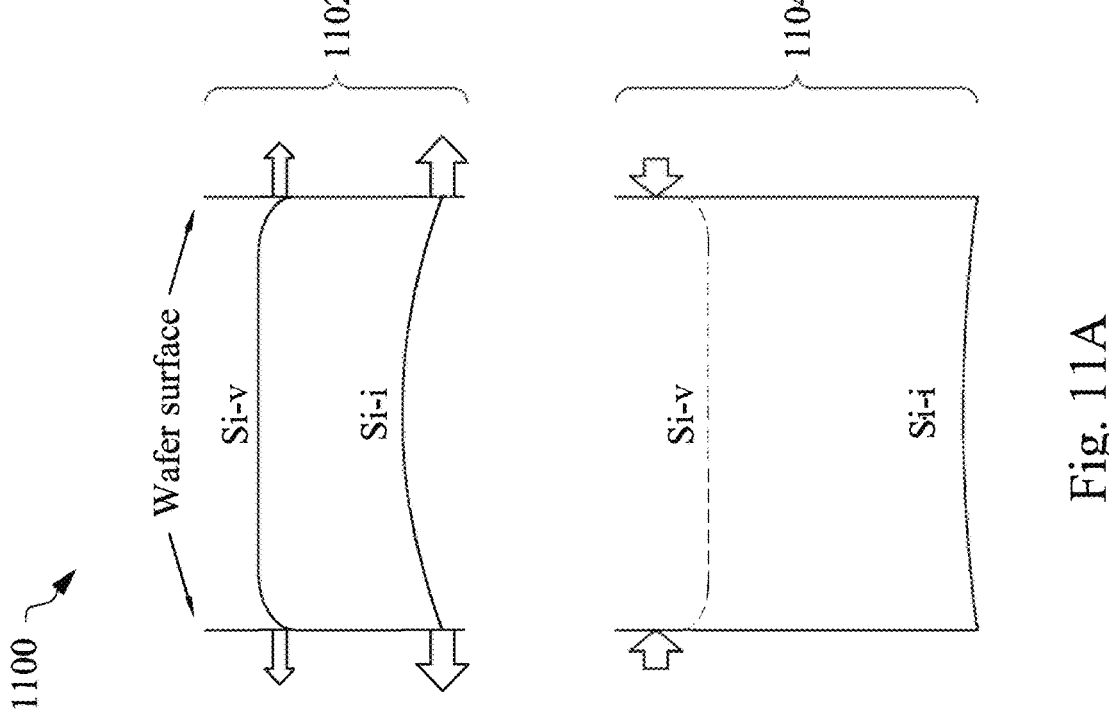

FIG. 11A shows resulting concentration profiles 1100 for vacancies (Si-v) 404 and self-interstitials (Si-i) 406. A top portion 1102 of FIG. 11A shows both vacancies 404 and self-interstitials 406 diffusing outward toward the silicon wafer edge during the high-temperature phase of the annealing operation 208. A bottom portion 1104 of FIG. 11A shows vacancies 404 being injected at the silicon wafer edge during the nitridation phase of the annealing process to further flatten the cross-wafer vacancy distribution (Si-v) shown as a dotted line. In some embodiments of the present disclosure, the high-temperature phase and the nitridation phase can occur at the same time. In some embodiments of the present disclosure, the nitridation phase and the high-temperature phase can be sequential but overlapping in time. In some embodiments of the present disclosure, the nitridation phase can be optional. The nearly flat concentration profiles shown in FIG. 11A indicate that interstitials have been reduced and vacancies have been increased across the wafer, which corresponds to improved thermal conductivity properties.

FIG. 11B shows before-and-after defect profiles for both self-interstitials 406 and vacancies 404. A top portion 1106 of FIG. 11B shows defect profiles before the nitrogen gas rapid thermal anneal process, where the profile of self-interstitials 406 is high at the edges and low in the center of the silicon wafer, while the profile of vacancies 404, shown as a dotted line, is high in the center and low at the edges of the silicon wafer. A bottom portion 1108 of FIG. 11B shows final spatial defect distributions for vacancies 404 and self-interstitials 406, both of which are uniform (flat) across the silicon wafer following the nitrogen gas rapid thermal anneal process. FIG. 11B summarizes the transformation that occurs during the high temperature and nitridation phases of the anneal process, to create a uniform concentration of vacancies and interstitials across the wafer.

Following operation 208, according to some embodiments of the present disclosure, the vacancy-rich silicon wafers can be evaluated to assess their thermal conductivity profile to determine readiness of the substrates to undergo a subsequent high-temperature process, such as an epitaxial gallium nitride deposition. Evaluating the vacancy-rich silicon wafers can include, for example, making a thermal map of a sample annealed wafer for comparison with a standard for cross-wafer uniformity of thermal conductivity. In accordance with FIG. 10B and FIG. 11B, such a thermal map can be substantially uniform from the center to the edge of the wafer, corresponding to the absence of oxidation induced stacking faults and self-interstitials 406.

Referring to FIG. 2, in operation 210, an epitaxial layer of gallium nitride can be deposited on the top surface of the silicon wafer. Alternatively, in some embodiments of the present disclosure, the epitaxial layer can be made of silicon dioxide instead of gallium nitride. An epitaxy process, in which gallium nitride atoms seamlessly align with silicon atoms of the substrate, provides a high quality crystalline layer in which to form integrated circuits. In some embodiments of the present disclosure, the epitaxial gallium nitride layer can be grown using a metal-organic chemical vapor deposition process at a temperature exceeding 900 degrees Celsius. At such a high temperature, the uniformity of the thermal conductivity of the substrate becomes even more important. If the thermal conductivity is compromised by the presence of interstitial defects, hot spots or temperature gradients can develop and degrade the quality of the epitaxial gallium nitride layer. The treatments described above for regulating thermal conductivity of the silicon wafer can also prevent similar effects that could occur at other high-temperature operations (for example, other operations that expose the silicon wafers to temperatures above 900 degrees Celsius) in the semiconductor chip manufacturing process, following operation 210.

During the gallium nitride epitaxial layer deposition process, temperature variations in metal-organic chemical vapor deposition equipment can affect product failure rates. In particular, the use of a larger radio frequency coil in the metal-organic chemical vapor deposition equipment correlated with fewer failures than metal-organic chemical vapor deposition equipment with a smaller radio frequency coil. This correlation suggested that an anneal process could decrease product failure rates.

Degradation of an epitaxial layer that is mismatched to a semiconductor substrate due to material stress can be alleviated by controlling thermal conductivity of the semiconductor substrate. A high thermal conductivity allows the semiconductor substrate to more easily distribute heat from high temperature processes used to form integrated circuits in the epitaxial layer. Because thermal conductivity is determined by a number and distribution of interstitial defects in the crystalline substrate, the thermal conductivity can be optimized by controlling the formation of such defects during production of the semiconductor substrate, and by reducing the number of remaining interstitial defects by post-processing with an annealing operation.

In some embodiments of the present disclosure, a method includes: forming a crystal ingot from a crystal melt by pulling a solid crystal from the crystal melt at a pulling velocity V, the crystal ingot having a central region and an outer radius; while forming the crystal ingot, adjusting a ratio of the pulling velocity V to an axial temperature gradient G, where adjusting a ratio of the pulling velocity V to the axial temperature gradient G (ratio V/G) adjusts characteristics of self-interstitial defects that form at the outer radius and vacancy defects that form in the central region; determining a region of the crystal ingot that is vacancy-rich; and cutting vacancy-rich semiconductor wafers from the vacancy-rich region of the crystal ingot.

In some embodiments of the present disclosure, a method includes: identifying vacancy-rich semiconductor wafers from among a group of semiconductor wafers; applying an annealing process to the vacancy-rich semiconductor wafers; and epitaxially growing gallium nitride on the annealed vacancy-rich semiconductor wafers.

In some embodiments of the present disclosure, a method includes: forming a crystal ingot from a crystal melt by pulling a solid crystal from the crystal melt at a pulling velocity V, the crystal ingot having a central region and an outer radius; while forming the crystal ingot, adjusting a ratio of the pulling velocity V to an axial temperature gradient G, where adjusting a ratio of the pulling velocity V to the axial temperature gradient G (ratio V/G) controls self-interstitial defects that form at the outer radius and vacancy defects that form in the central region; determining a region of the crystal ingot that is vacancy-rich; cutting vacancy-rich wafers from the vacancy-rich region of the crystal ingot; and evaluating the vacancy-rich wafers.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a crystal ingot from a crystal melt by pulling a solid crystal from the crystal melt at a pulling velocity V, the crystal ingot having a central region and an outer radius;

while forming the crystal ingot, adjusting a ratio of the pulling velocity V to an axial temperature gradient G(V/G), wherein adjusting the ratio V/G adjusts characteristics of self-interstitial defects that form at the outer radius and vacancy defects that form in the central region;

selecting a vacancy-rich region of the crystal ingot, wherein the vacancy-rich region comprises an oxidation induced stacking fault ring;

cutting vacancy-rich semiconductor wafers from the vacancy-rich region of the crystal ingot; and removing the oxidation induced stacking fault ring in the vacancy-rich semiconductor wafers.

2. The method of claim 1, wherein forming the crystal ingot comprises forming a silicon crystal ingot, and wherein cutting the vacancy-rich semiconductor wafers comprises cutting vacancy-rich silicon wafers.

3. The method of claim 1, wherein the characteristics of the self-interstitial and vacancy defects comprise one or more of a number of the self-interstitial and vacancy defects, a density of the self-interstitial and vacancy defects, and a distribution of the self-interstitial and vacancy defects.

4. The method of claim 1, wherein pulling the solid crystal comprises pulling a solid crystal that is suitable for manufacturing semiconductor devices comprising one or more of silicon, germanium, compound semiconductors, and alloy semiconductors.

5. The method of claim 1, wherein the ratio V/G is within a range of about 0.00155 cm$^2$/min ° K to about 0.0020 cm$^2$/min ° K.

6. A method, comprising:

identifying vacancy-rich semiconductor wafers from among a group of semiconductor wafers, wherein a peripheral region of each of the vacancy-rich semiconductor wafers comprises an oxidation induced stacking fault ring;

removing the oxidation induced stacking fault ring by applying an annealing process to the vacancy-rich semiconductor wafers;

performing a nitridation operation that exposes the vacancy-rich semiconductor wafers to a nitrogen gas; and epitaxially growing gallium nitride on the annealed vacancy-rich semiconductor wafers.

7. The method of claim 6, wherein applying the annealing process comprises performing a thermal operation that exposes the vacancy-rich semiconductor wafers to temperatures greater than about 1200° C.

8. The method of claim 7, wherein a high-temperature phase of the thermal operation has a duration between about 60 seconds and 200 seconds.

9. The method of claim 6, wherein a gas pressure of the nitridation operation is between about 0.9 atm and about 1.1 atm.

10. The method of claim 6, further comprising, after the annealing process, evaluating a thermal conductivity of the vacancy-rich semiconductor wafers.

11. The method of claim 10 wherein evaluating the thermal conductivity of the vacancy-rich silicon wafers comprises making a thermal map of an annealed wafer for comparison with a standard for cross-wafer uniformity of thermal conductivity.

12. The method of claim 6, further comprising, after the annealing process, evaluating a vacancy density of the vacancy-rich wafers.

13. The method of claim 6, wherein identifying the vacancy-rich semiconductor wafers comprises evaluating a vacancy density of the group of semiconductor wafers by creating a wafer map showing a profile of oxidation induced stacking faults.

14. The method of claim 13, wherein identifying the vacancy-rich semiconductor wafers comprises a quality control operation in which features of vacancy-rich wafers are enhanced by imaging for automated detection.

15. The method of claim 13, wherein identifying the vacancy-rich semiconductor wafers comprises a quality control operation in which features of vacancy-rich wafers are enhanced by wet chemical processing for automated detection.

16. The method of claim 6, wherein epitaxially growing the gallium nitride on the annealed vacancy-rich semiconductor wafers comprises epitaxially growing the gallium nitride using a metal-organic chemical vapor deposition process.

17. A method, comprising:

forming a crystal ingot from a crystal melt by pulling a solid crystal from the crystal melt at a pulling velocity V, wherein the crystal ingot comprises a central region and an outer radius;

while forming the crystal ingot, adjusting a ratio of the pulling velocity V to an axial temperature gradient G, wherein adjusting a ratio of the pulling velocity V to the axial temperature gradient G (ratio V/G) controls self-interstitial defects that form at the outer radius and vacancy defects that form in the central region;

determining a region of the crystal ingot that is vacancy-rich;

cutting vacancy-rich wafers from the vacancy-rich region of the crystal ingot;

evaluating the vacancy-rich wafers against a set of selection criteria; and removing interstitials in the vacancy-rich wafers.

18. The method of claim 17, wherein evaluating the vacancy-rich wafers comprises analyzing an image of one or more oxidation induced stacking fault rings around edges of the vacancy-rich wafers.

19. The method of claim 17, wherein evaluating the vacancy-rich wafers comprises one or more of evaluating a photoluminescent wafer map, inspecting an oxidized wafer, and inspecting defects on a Secco-etched wafer.

20. The method of claim 17, further comprising removing oxidation induced stacking fault rings in the vacancy-rich wafers.

* * * * *